(12) United States Patent
Chikamori

(10) Patent No.: US 9,077,286 B2
(45) Date of Patent: Jul. 7, 2015

(54) OPTICAL AMPLIFIER THAT CONTROLS LEVEL OF OPTICAL OUTPUT SIGNAL

(75) Inventor: Shun Chikamori, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 350 days.

(21) Appl. No.: 13/522,042

(22) PCT Filed: Apr. 12, 2011

(86) PCT No.: PCT/JP2011/002168
§ 371 (c)(1),
(2), (4) Date: Jul. 13, 2012

(87) PCT Pub. No.: WO2011/129101
PCT Pub. Date: Oct. 20, 2011

(65) Prior Publication Data
US 2013/0140443 A1    Jun. 6, 2013

(30) Foreign Application Priority Data
Apr. 12, 2010  (JP) ................. 2010-091469

(51) Int. Cl.
| | |
|---|---|
| H01S 5/50 | (2006.01) |
| H03F 3/08 | (2006.01) |
| H04B 10/291 | (2013.01) |
| H04B 10/293 | (2013.01) |
| H01S 3/067 | (2006.01) |
| H01S 3/13 | (2006.01) |

(52) U.S. Cl.
CPC ............... H03F 3/08 (2013.01); H04B 10/291 (2013.01); H04B 10/2931 (2013.01); *H01S 3/06754* (2013.01); *H01S 3/1306* (2013.01); *H01S 3/1301* (2013.01)

(58) Field of Classification Search
CPC ............. H01S 3/06754–3/06787; H01S 5/50; H04B 10/291; H04B 10/2912–10/2918; H04B 2210/003; H04B 2210/08; H03G 1/0052; H03G 1/0058; H03G 3/004
USPC ................. 250/214 A, 214 AL; 359/333, 359/337.11–13, 341.41, 341.42, 341.44
See application file for complete search history.

(56) References Cited

U.S. PATENT DOCUMENTS

| | | | |
|---|---|---|---|
| 5,963,362 A | 10/1999 | Fukaishi | |
| 6,891,659 B2 * | 5/2005 | Kikuchi | ........... 359/334 |

(Continued)

FOREIGN PATENT DOCUMENTS

| | | |
|---|---|---|
| EP | 0 954 125 A2 | 11/1999 |
| JP | 5 83201 | 4/1993 |

(Continued)

OTHER PUBLICATIONS

Extended European Search Report issued on Jan. 22, 2014, in European Patent Application No. 11768624.6.

(Continued)

*Primary Examiner* — Renee D Chavez
(74) *Attorney, Agent, or Firm* — Oblon, McClelland, Maier & Neustadt, L.L.P.

(57) ABSTRACT

An optical amplifier includes: an optical amplification unit implementing optical amplification on an optical signal input from an input end to output the amplified optical signal from an output end to a device through a transmission line; a branching unit branching light from the output end, where the light contains reflected-light or/and optical feedback; a photo-detector receiving the branched light and detecting optical level of the received light; and a control circuit reducing an amount of optical amplification of the optical amplification unit in case where the detected optical level becomes more than or equal to a first threshold. The control circuit normalizes the amount of optical amplification in case where a variation of the optical level detected by the photo-detector becomes less than or equal to a second threshold, where the variation of the optical level has been brought by the reduction of the amount of optical amplification.

5 Claims, 5 Drawing Sheets

(56) References Cited

U.S. PATENT DOCUMENTS

| | | |
|---|---|---|
| 2005/0200944 A1 | 9/2005 | Kobayashi et al. |
| 2009/0169203 A1 | 7/2009 | Hakomori |

FOREIGN PATENT DOCUMENTS

| | | |
|---|---|---|
| JP | 5 291668 | 11/1993 |
| JP | 5 327622 | 12/1993 |
| JP | 7 15055 | 1/1995 |
| JP | 9 200130 | 7/1997 |
| JP | 10 209543 | 8/1998 |
| JP | 2004 15271 | 1/2004 |
| JP | 2005 260700 | 9/2005 |
| JP | 2009 159293 | 7/2009 |

OTHER PUBLICATIONS

International Search Report Issued May 17, 2011 in PCT/JP11/02168 Filed Apr. 12, 2011.

* cited by examiner

OPTICAL AMPLIFIER THAT CONTROLS LEVEL OF OPTICAL OUTPUT SIGNAL

TECHNICAL FIELD

This invention relates to optical amplifiers which are utilized in optical communication apparatuses etc. and utilized for directly amplifying input light.

BACKGROUND ART

Optical amplifiers utilized in optical communication apparatuses etc. are adapted to implement optical amplification on optical level of optical input signals, and to output the amplified optical signals. Generally, an output end of the optical amplifier is configured as a coupling connector for an optical fiber, and is connected to other device through the optical fiber.

In the case where the connector is failure in connection, the optical signal output from the optical amplifier leaks from the output end toward free space. Since the optical signal leaking from the optical amplifier possesses high power, the leak light may trigger a rise in temperature of objects around the optical amplifier or may cause dangerous to human beings. If the leak light hits human eyes, he/she may be blinded.

For the above reasons, the optical amplifier is adapted to activate an eye protective function to automatically reduce the output level of the optical amplifier in the case where the output end as the connector is failure in connection. Upon occurrence of the failure in connection, the optical fiber of output side becomes an open end. A part of the light is reflected at the open end, and then returns to the optical amplifier as reflected-light. The eye protective function is adapted such that the detector is provided to detect the reflected-light input to the optical amplifier. The eye protective function is further adapted to determine the occurrence of failure in connection when the detector detects reflected-light, and to reduce an amount of optical amplification of the optical amplifier (Ref. e.g. Patent Literatures 1 and 2).

Besides the reflected-light caused by trouble of a transmission line such as the failure in connection discussed in above, optical feedback may occur in some cases. The optical feedback comes from a device connected to the optical amplifier toward the output end of this optical amplifier. Although causes of the optical feedback depend on a kind of the device, one of exemplary causes is assumed by a multistage connection of optical amplifiers. In such the multistage connection, leak light of excitation light used for optical amplification at a later stage of the multistage may return to an earlier stage. The detector at the earlier stage detects optical level of reflected-light to which optical feedback is added. A threshold is therefore set to the optical amplifier in order to distinguish whether the light from the output end is reflected-light caused by trouble of a transmission line or by optical feedback which constantly comes from the device. This optical amplifier determines the occurrence of trouble of the transmission line in the case where the detected optical level exceeds the threshold, and then activates the eye protection function to reduce the amount of optical amplification of the optical amplifier.

RELATED ART DOCUMENT

Patent Literature 1: JP-A-05-291668
Patent Literature 2: JP-A-2004-015271

SUMMARY OF INVENTION

However, in a configuration that the optical amplifier is directly connected with a submarine cable, optical feedback arises from a supervisory optical signal used for monitoring a condition of the submarine cable or from leak light of an excitation light source of the optical amplifier in a submarine repeater. The supervisory optical signal causes fluctuation in power depending on the condition of the submarine cable. For this reason, optical level of the optical feedback may become greater than optical level of the reflected-light. In this case, it is difficult to distinguish between reflected-light and optical feedback based on a threshold as in the optical amplifiers of the related art. Therefore, there is a problem that the eye protective function may be activated even when the transmission line does not in trouble.

Furthermore, since the conditions of submarine transmission lines differ among the submarine repeaters, it is also difficult to optimize the thresholds. Hence, it was difficult to distinguish between reflected-light and optical feedback by using the thresholds set to the optical amplifiers of the related art aiming for detecting trouble of transmission line. Thus, there is a problem that the eye protective function may be activated by other factors than originally intended factors for the eye protective function, such as the trouble of transmission line.

The present invention has been made to provide solutions for the above problems, and to achieve an object that provide an optical amplifier which is capable of swiftly terminating an eye protective function by normalizing the optical amplifier when the eye protective function is unnecessarily activated, and thus improving reliability of the system.

An optical amplifier according to the present invention includes: an optical amplification unit configured to implement optical amplification on an optical signal input from an input end to output the amplified optical signal from an output end to a device through a transmission line; a branching unit configured to branch light input from the output end toward the optical amplifier, the light containing reflected-light caused by trouble of the transmission line or/and optical feedback coming from the device; a photo-detector configured to receive the light branched by the branching unit, and to detect optical level of the received light; and a control circuit configured to reduce an amount of optical amplification of the optical amplification unit in case where the optical level detected by the photo-detector becomes more than or equal to a first threshold previously fixed, wherein the control circuit normalizes the amount of optical amplification of the optical amplification unit in case where a variation of the optical level detected by the photo-detector becomes less than or equal to a second threshold previously fixed, the variation of the optical level being brought by the reduction of the amount of optical amplification of the optical amplification unit.

According to the invention, being configured as above, an optical amplifier includes: an optical amplification unit configured to implement optical amplification on an optical signal input from an input end to output the amplified optical signal from an output end to a device through a transmission line; a branching unit configured to branch light input from the output end toward the optical amplifier, the light containing reflected-light caused by trouble of the transmission line or/and optical feedback coming from the device; a photo-detector configured to receive the light branched by the branching unit, and to detect optical level of the received light; and a control circuit configured to reduce an amount of optical amplification of the optical amplification unit in case where the optical level detected by the photo-detector becomes more than or equal to a first threshold previously fixed, wherein the control circuit normalizes the amount of optical amplification of the optical amplification unit in case where a variation of the optical level detected by the photo-detector becomes less than or equal to a second threshold previously fixed, the variation of the optical level being brought by the reduction of the amount of optical amplification of the optical amplification unit. This invention is capable of swiftly terminating an eye protective function by normalizing the optical amplifier when the eye protective function is unnecessarily activated, and thus improving reliability of the system.

DESCRIPTION OF EMBODIMENTS

Embodiments of the invention are described below in detail with reference to the drawings.
Embodiment 1

Figure 1:
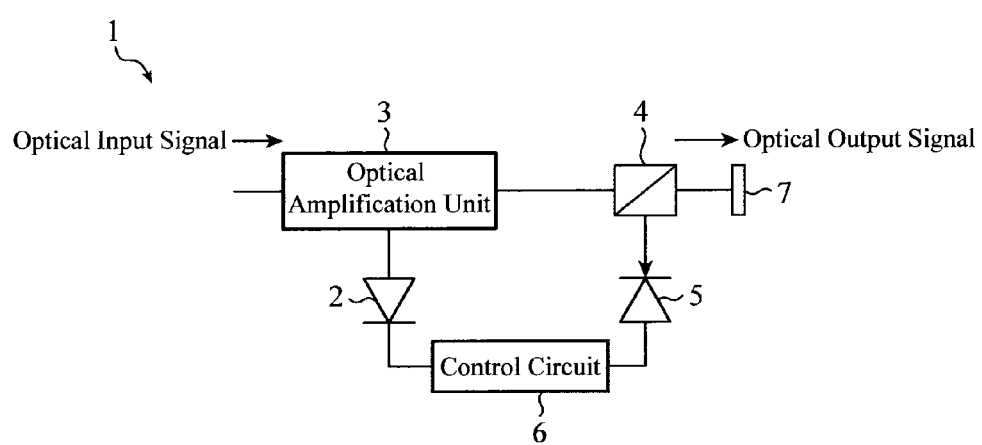
FIG. 1 depicts a configuration of an optical amplifier according to Embodiment 1 of the invention.

FIG. 1 depicts a configuration of an optical amplifier 1 according to Embodiment 1 of the present invention.

As shown in FIG. 1, the optical amplifier 1 includes an excitation light source 2, an optical amplification unit 3, a branching unit 4, a photo-detector 5, and a control circuit 6.

The optical amplification unit 3 is adapted to implement optical amplification on optical signal input from an input end by using excitation light emitted from the excitation light source 2. The optical amplification unit 3 comprises, for example, an Er (Erbium)-doped fiber. The optical signal optically amplified by the optical amplification unit 3 is output to a device (not depicted) at a later stage through an optical fiber (i.e. a transmission line) (not depicted) which is connected to an output end 7 of the optical amplifier 1.

The branching unit 4 is adapted to branch light input from the output end 7 into the optical amplifier 1. The light contains reflected-light caused by trouble of the transmission line such as disconnection of a connector or breakage of an optical fiber, or/and caused by optical feedback coming from the device at the later stage. The optical feedback may be a supervisory optical signal for monitoring a condition of a submarine cable or may be leak light from an excitation light source of an optical amplifier in a submarine repeater. The light branched by the branching unit 4 is output to the photo-detector 5.

The photo-detector 5 is adapted to detect the optical level of the light branched by the branching unit 4. Data indicating the optical level detected by the photo-detector 5 is output to the control circuit 6.

The control circuit 6 is adapted to activate an eye protective function. The control circuit 6 reduces an amount of optical amplification of the optical amplification unit 3 to a first predetermined value by lowering an output level of the excitation light source 2 in case where the optical level detected by the photo-detector 5 becomes more than or equal to a first threshold previously fixed. At this time, the control circuit 6 records the optical level detected by the photo-detector 5. The first predetermined value may indicate a value which is capable of preventing objects or human bodies existing outside of the optical amplifier 1 from taking a risk of leak light from the output end 7.

After reducing the amount of optical amplification of the optical amplification unit 3 to the first predetermined value by the eye protective function, the control circuit 6 reduces the amount of optical amplification to a second predetermined value by further lowering the output level of the excitation light source 2. The second predetermined value may indicate a value which is capable of preventing the optical signal from being completely shielded.

At the time when the amount of optical amplification is reduced to the second predetermined value, the control circuit 6 compares the optical level detected by the photo-detector 5 with the optical level which has already been recorded. By implementing this comparison, the control circuit 6 acquires a variation of optical level of light input from the output end 7, which has been brought by reducing the amount of optical amplification from the first predetermined value to the second predetermined value.

It is to be noted here that reflected-light caused by trouble of the transmission line may arise at a reflection point, such as an open end of optical fiber, in accordance with a reflectance of the light. Therefore, the reflected-light possesses a reduction characteristic which follows a reduction of the amount of optical amplification of the optical amplification unit 3. In contrast to the reflected-light, optical feedback coming from the devices possesses a characteristic which hardly varies regardless of the reduction in amount of optical amplification of the optical amplification unit 3.

Hence, in the case where the optical level detected by the photo-detector 5 reduces at almost constant proportion, and besides, a variation of the reduction of the optical level becomes more than or equal to a second threshold previously fixed, the control circuit 6 determines that the light input from the output end 7 into the optical amplifier 1 is reflected-light. The second threshold has been set based on reduction values of the amount of optical amplification of the optical amplification unit 3. When determining the reflected-light, the control circuit 6 recognizes that trouble of transmission line has been happened, and then determines that the eye protective function should be continued.

Meanwhile, in the case where the optical level detected by the photo-detector 5 hardly varies regardless of the reduction in amount of optical amplification of the optical amplification unit 3, and besides, the variation amount is less than or equal to the second threshold, the control circuit 6 determines that the light input from the output end 7 is optical feedback. When determining the optical feedback, the control circuit 6 recognizes that trouble of transmission line has not been happened. In this case, the control circuit 6 terminates the eye protective function by normalizing the amount of optical amplification of the optical amplification unit 3.

The operation of the optical amplifier 1 configured as above is described next.

Figure 2:
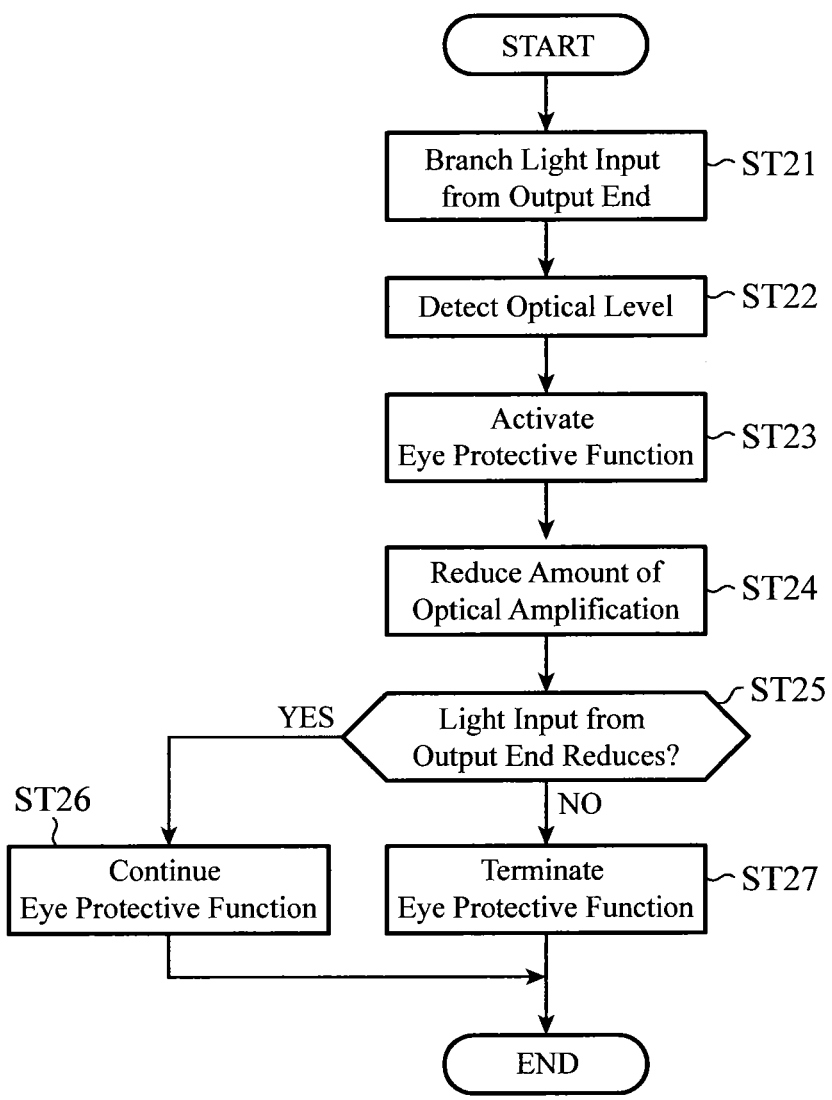
FIG. 2 is a flowchart describing the operation of the optical amplifier according to the Embodiment 1 of the invention.

FIG. 2 shows a flowchart of the operation of the optical amplifier 1 according to the Embodiment 1 of the present invention.

Figure 3:
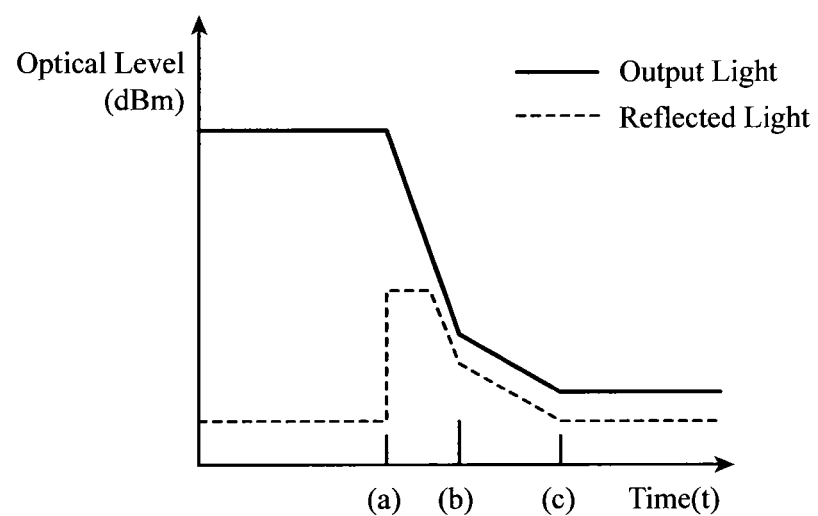
FIG. 3 depicts a change of optical level in the optical amplifier according to the Embodiment 1 of the invention when an eye protective function is activated by reflected-light.
Figure 4:
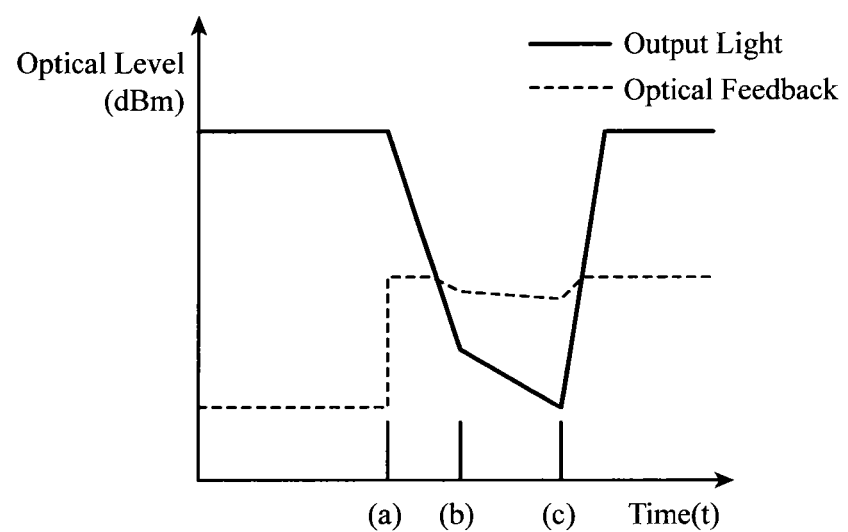
FIG. 4 depicts a change of optical level in the optical amplifier according to the Embodiment 1 of the invention when the eye protective function is activated by optical feedback.

FIG. 3 depicts a change of optical level in the optical amplifier 1 according to the Embodiment 1 when the eye protective function is activated by determining reflected-light. FIG. 4 depicts a change of optical level when the eye protective function is activated by determining optical feedback. In FIG. 3, the solid line indicates the optical level of the optical output signal from the optical amplifier 1, and the dotted line indicates the optical level of the reflected-light. In FIG. 4, the solid line indicates the optical level of the optical output signal from the optical amplifier 1, and the dotted line indicates the optical level of the optical feedback.

As depicted in FIG. 3(*a*), when the trouble of transmission line, such as disconnection of a connector or breakage of an optical fiber, is happened at a later stage than the output end 7, the reflected-light enters from the output end 7 into the optical amplifier 1 by occurring Fresnel reflection from the output end 7. As depicted in FIG. 4(*a*), when optical feedback arises due to some factors, such as a submarine cable or a submarine repeater in the device at a later stage than the output end 7, the optical feedback enters from the output end 7 into the optical amplifier 1.

In the case where reflected-light or/and optical feedback is/are input from the output end 7 to the optical amplifier 1, the branching unit 4 branches the input light (step ST21) as depicted in FIG. 2. The light branched by the branching unit 4 is output to the photo-detector 5.

The photo-detector 5 detects the optical level of the light branched by the branching unit 4 (step ST22). Data indicating the optical level detected by the photo-detector 5 is output to the control circuit 6.

In the case where the optical level detected by the photo-detector 5 is more than or equal to the first threshold, the control circuit 6 activates the eye protective function (step ST23) by lowering an output level of the excitation light source 2 to reduce the amount of optical amplification of the optical amplification unit 3 to the first predetermined value, as depicted in FIGS. 3(*b*) and 4(*b*). The control circuit 6 records the optical level detected by the photo-detector 5 at this time.

Next, as depicted in FIGS. 3(*c*) and 4(*c*), the control circuit 6 reduces the amount of optical amplification of the optical amplification unit 3 to the second predetermined value by further lowering the output level of the excitation light source 2 (step ST24).

The control circuit 6 compares the optical level detected by the photo-detector 5 at this time with the recorded optical level. The control circuit 6 then determines whether the optical level detected by the photo-detector 5 has reduced following the decrease of the amount of optical amplification of the optical amplification unit 3 from the first predetermined value to the second predetermined value, and whether a variation of the reduction amount is more than or equal to the second threshold (step ST25).

In step ST25, when determining that the optical level has reduced at almost constant proportion following the reduction in amount of optical amplification of the optical amplification unit 3, and besides, the variation amount is more than or equal to the second threshold, as depicted in FIG. 3, the control circuit 6 determines that the light input from the output end 7 is reflected-light. In this case, the control circuit 6 recognizes that trouble of transmission has been happened, and then continues the eye protective function (step ST26).

Meanwhile, in step ST25, when determining that the optical level hardly varies regardless of the reduction in amount of optical amplification of the optical amplification unit 3, and besides, the variation amount is less than or equal to the second threshold, as depicted in FIG. 4, the control circuit 6 determines that the light input from the output end 7 is optical feedback. In this case, the control circuit 6 recognizes that trouble of transmission has not been happened, and then terminates the eye protective function by normalizing the amount of optical amplification of the optical amplification unit 3 (step ST27).

As described above, according to the Embodiment 1, the optical amplifier 1 is adapted to determine whether the light input from the output end 7 into the optical amplifier 1 is reflected-light or optical feedback by reducing the amount of optical amplification of the optical amplification unit 3 while activating the eye protective function, and detecting the variation of the optical level detected by the photo-detector 5 due to the reduction in amount of optical amplification. This configuration is capable of swiftly terminating the eye protective function to normalize the output level of the optical amplifier 1 when the eye protective function is unnecessarily activated. Therefore, the reliability of the system is improved.

In the Embodiment 1, while activating the eye protective function, the amount of optical amplification of the optical amplification unit 3 is reduced to the first predetermined value, and then further reduced to the second predetermined value. However, the configuration of the Embodiment 1 is not limited to such two-steps reduction. The amount of optical amplification of the optical amplification unit 3 may be reduced to the second predetermined amount in one step upon activation of the eye protective function.

Embodiment 2

Figure 5:
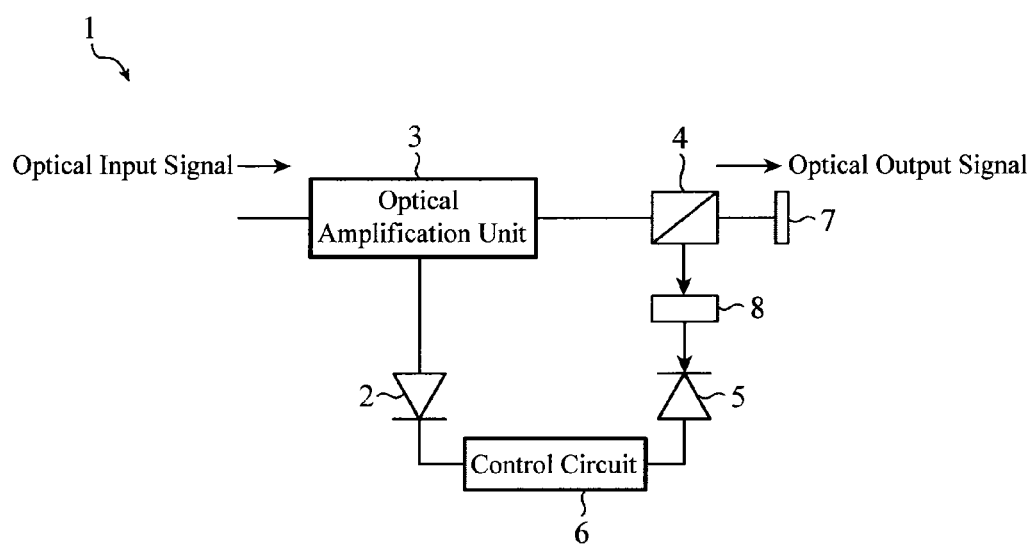
FIG. 5 depicts a configuration of an optical amplifier according to Embodiment 2 of the invention.

In the case where an optical amplifier 1 is connected directly to a submarine cable, optical feedback occurs by optical signals utilized for monitoring a condition of the submarine cable. Since the optical signal for monitoring the condition of the submarine cable has a known wavelength, a wavelength of the optical feedback indicates the known wavelength. As depicted in FIG. 5, the optical amplifier 1 is equipped with an optical wavelength filter 8 between the branching unit 4 and the photo-detector 5. The wavelength filter 8 is adapted to eliminate optical feedback having the known wavelength. By adopting this configuration, optical feedback having the known wavelength is eliminated from light to be input to the photo-detector 5, and the eye protective function is capable of being activated on occurrence of the trouble of transmission line such as disconnection of a connector. Therefore, reliability of the system is improved.

INDUSTRIAL APPLICABILITY

As described above, the optical amplifier according to the present invention is capable of swiftly terminating an eye protective function to normalize an output level of the optical amplifier when the eye protective function is unnecessarily activated, thus allowing for improvement in reliability of the system. The optical amplifier according to the present invention is suitably used in, for example, an optical communication apparatus in an optical communication system.

REFERENCE SIGNS LIST

1: optical amplifier, 2: excitation light source, 3: optical amplification unit, 4: branching unit, 5: photo-detector, 6: control circuit, 7: output end, 8: optical wavelength filer

The invention claimed is:
1. An optical amplifier comprising:
an optical amplifier circuit that implements optical amplification on an optical signal input from an input end of the optical amplifier to output the amplified optical signal from an output end of the optical amplifier to a device through a transmission line;
a branching circuit that branches light input from the output end toward the optical amplifier;
a photo-detector that receives the light branched by the branching circuit, and to detect optical level of the received light; and a control circuit that reduces an amount of optical amplification of the optical amplifier circuit in case where the optical level detected by the photo-detector becomes more than or equal to a threshold previously fixed, wherein the control circuit increases the amount of optical amplification of the optical amplifier circuit when a variation in reduction of the optical level detected by the photo-detector becomes less than or equal to a predetermined variation, the variation of the optical level being brought by the reduction of the amount of optical amplification.

2. The optical amplifier according to claim 1,
wherein when the optical level detected by the photo-detector becomes more than or equal to the threshold previously fixed, the control circuit reduces the amount of optical amplification from a current value to a first predetermined value and further reducing said amount of optical amplification from the first predetermined value to a second predetermined value, and wherein the variation in reduction of the optical level detected by the photo-detector indicates a variation brought by the further reduction of the optical amplifier from the first predetermined value to the second predetermined value.

3. The optical amplifier according to claim 1, further comprising:
a filter circuit that eliminates optical feedback having a known wavelength input from the output end toward the optical amplifier, wherein the filter circuit is disposed between the optical amplifier circuit and the branching circuit.

4. The optical amplifier according to claim 1,
wherein, when the optical level detected by the photo-detector becomes more than the threshold previously fixed, the control circuit reduces the amount of optical amplification from a current value to a predetermined value, and wherein the variation in reduction of the optical level detected by the photo-detector indicates a variation brought by the reduction of the optical amplifier from the current value to the predetermined value.

5. The optical amplifier according to claim 1, wherein, when the variation in reduction of the optical level detected by the photo-detector becomes more than the predetermined variation, the control circuit continues the amount of optical amplification of the optical amplifier circuit, which has been reduced.

* * * * *